US012616056B2

(12) United States Patent
Shin et al.

(10) Patent No.: US 12,616,056 B2
(45) Date of Patent: Apr. 28, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: In Sup Shin, Suwon-si (KR);
Jung-Seok Ahn, Suwon-si (KR);
Hyeong Mun Kang, Suwon-si (KR);
Seung Woo Sim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 416 days.

(21) Appl. No.: 18/113,163

(22) Filed: Feb. 23, 2023

(65) Prior Publication Data

US 2024/0014087 A1 Jan. 11, 2024

(30) Foreign Application Priority Data

Jul. 5, 2022 (KR) ........................ 10-2022-0082267

(51) Int. Cl.
H01L 23/31 (2006.01)
H01L 21/56 (2006.01)
(Continued)

(52) U.S. Cl.
CPC ........ H01L 23/3135 (2013.01); H01L 21/561 (2013.01); H01L 21/6836 (2013.01);
(Continued)

(58) Field of Classification Search
CPC ............... H01L 25/0657; H01L 25/043; H01L 23/4012; H01L 21/6836
See application file for complete search history.

(56) References Cited

U.S. PATENT DOCUMENTS 8,141,612 B2 3/2012 Chan et al.
8,294,251 B2 10/2012 Takiar et al.
(Continued)

FOREIGN PATENT DOCUMENTS

KR 10-2008-0108251 12/2008
KR 10-2017-0140985 A 12/2017

OTHER PUBLICATIONS

Office Action dated Nov. 24, 2025 issued in the corresponding Korean Patent Application No. 10-2022-0082267.

*Primary Examiner* — Eva Y Montalvo
(74) *Attorney, Agent, or Firm* — MORGAN, LEWIS & BOCKIUS LLP

(57) ABSTRACT

A semiconductor package includes: a substrate including a first region and a second region at least partially surrounding the first region in a plane defined by first and second horizontal directions, wherein the substrate has a first surface and a second surface opposed to the first surface; a wiring pattern disposed on the first surface of the substrate; a first recess formed on the second surface of the substrate and in the second region of the substrate; a back side insulating layer disposed on the second surface of the substrate, wherein the back side insulating layer fills an inside of the first recess; a through via penetrating through the first region of the substrate and the back side insulating layer, wherein the through via connects to the wiring pattern; and a second recess formed in the back side insulating layer and on the first recess.

14 Claims, 16 Drawing Sheets

(51) Int. Cl.

| | |
|---|---|
| *H01L 21/683* | (2006.01) |
| *H01L 23/00* | (2006.01) |
| *H01L 23/13* | (2006.01) |
| *H01L 23/498* | (2006.01) |
| *H01L 25/065* | (2023.01) |
| *H01L 25/16* | (2023.01) |
| *H10B 80/00* | (2023.01) |

(52) U.S. Cl.

CPC .......... *H01L 23/13* (2013.01); *H01L 23/3178* (2013.01); *H01L 23/49827* (2013.01); *H01L 24/08* (2013.01); *H01L 24/16* (2013.01); *H01L 24/32* (2013.01); *H01L 24/73* (2013.01); *H01L 25/0657* (2013.01); *H01L 25/16* (2013.01); *H01L 2221/68327* (2013.01); *H01L 2224/08113* (2013.01); *H01L 2224/16148* (2013.01); *H01L 2224/32058* (2013.01); *H01L 2224/32059* (2013.01); *H01L 2224/32145* (2013.01); *H01L 2224/73204* (2013.01); *H01L 2225/06513* (2013.01); *H01L 2225/06541* (2013.01); *H01L 2924/182* (2013.01); *H10B 80/00* (2023.02)

(56)         References Cited

U.S. PATENT DOCUMENTS

| | | |
|---|---|---|
| 9,941,252 B2 | 4/2018 | Lee |
| 10,325,861 B2 | 6/2019 | Miccoli |
| 10,510,724 B2 | 12/2019 | Yoo et al. |
| 11,062,925 B2 | 7/2021 | Negishi et al. |
| 2017/0358558 A1* | 12/2017 | Lee .................... H01L 25/0657 |

\* cited by examiner

WFa
WFb
WFc

SEMICONDUCTOR PACKAGE AND METHOD OF MANUFACTURING THE SAME

CROSS-REFERENCE TO RELATED APPLICATION

This application claims priority under 35 U.S.C. 119(a) to Korean Patent Application No. 10-2022-0082267 filed on Jul. 5, 2022 in the Korean Intellectual Property Office, the disclosure of which is incorporated by reference herein in its entirety.

TECHNICAL FIELD

The present inventive concept relates to a semiconductor package and a method of manufacturing the semiconductor package.

DISCUSSION OF THE RELATED ART

With the rapid development of the electronic industry and user demand, electronic devices have become smaller, lighter, and multifunctional. Accordingly, smaller, lighter, and multifunctional semiconductor packages may be used in the electronic devices. Generally, two or more types of semiconductor chips may be integrated into a single semiconductor package to reduce the size of the semiconductor package and to allow the semiconductor package to have more capacity and more functions.

To increase the capacity of a semiconductor package, a thickness of a semiconductor chip is reduced. However, in the process of manufacturing the semiconductor chip, process failures may occur due to a warping of the semiconductor chip that has a relatively thin thickness.

SUMMARY

Aspects of the present inventive concept provide a semiconductor package in which a recess is formed on an exposed surface of an edge of a back side insulating layer of a semiconductor chip to reduce a contact area between the back side insulating layer and a tape, thereby facilitating separation of the tape from the back side insulating layer.

Aspects of the present inventive concept provide a method of manufacturing a semiconductor package in which a recess is formed on an exposed surface of an edge of a back side insulating layer of a semiconductor chip to reduce a contact area between the back side insulating layer and a tape, thereby facilitating separation of the tape from the back side insulating layer.

According to an embodiment of the present inventive concept, a semiconductor package includes: a substrate including a first region and a second region at least partially surrounding the first region in a plane defined by a first horizontal direction and a second horizontal direction substantially perpendicular to the first horizontal direction, wherein the substrate has a first surface and a second surface opposed to the first surface; a wiring pattern disposed on the first surface of the substrate; a first recess formed on the second surface of the substrate and in the second region of the substrate; a back side insulating layer disposed on the second surface of the substrate, wherein the back side insulating layer fills an inside of the first recess; a through via penetrating through the first region of the substrate and the back side insulating layer, wherein the through via connects to the wiring pattern; and a second recess formed in the back side insulating layer and on the first recess.

According to an embodiment of the present inventive concept, a semiconductor package includes: a first semiconductor chip; a second semiconductor chip disposed on the first semiconductor chip; a connection terminal configured to electrically connect the first semiconductor chip to the second semiconductor chip; and an underfill material configured to at least partially surround sidewalls of the connection terminal between the first semiconductor chip and the second semiconductor chip, wherein the first semiconductor chip includes: a substrate including a first region and a second region at least partially surrounding the first region in a plane defined by a first horizontal direction and a second horizontal direction substantially perpendicular to the first horizontal direction, wherein the substrate has a first surface and a second surface opposed to the first surface; a wiring pattern disposed on the first surface of the substrate; a first recess formed on the second surface of the substrate and in the second region of the substrate; a back side insulating layer disposed on the second surface of the substrate, wherein the back side insulating layer fills an inside of the first recess and includes a material different from that of the underfill material, a through via penetrating through the first region of the substrate and the back side insulating layer, wherein the through via connects to the wiring pattern; and a second recess formed in the back side insulating layer and on the first recess, wherein the second recess is filled with the underfill material.

According to an embodiment of the present inventive concept, a method of manufacturing a semiconductor package includes: providing a wafer including a first surface and a second surface opposed to the first surface; forming a wiring pattern on the first surface of the wafer; forming a first recess on the second surface of the wafer; forming a back side insulating layer on the second surface of the wafer, wherein the back side insulating layer fills an inside of the first recess, wherein the back side insulating layer includes a second recess overlapping the first recess; attaching a tape onto the back side insulating layer; forming a first semiconductor chip with the tape attached thereto by sawing the wafer, the back side insulating layer and the tape; and separating the tape from the back side insulating layer.

However, aspects of the present inventive concept are not restricted to those set forth herein. The above and other aspects of the present inventive concept will become more apparent to those of ordinary skill in the art to which the present inventive concept pertains by referencing the detailed description of the present inventive concept given below.

It should be noted that the effects of the present inventive concept are not limited to those described above, and other effects of the present inventive concept will be apparent from the following description.

BRIEF DESCRIPTION OF THE DRAWINGS

The above and features of the present inventive concept will become more apparent by describing in detail exemplary embodiments thereof with reference to the attached drawings, in which:

FIG. 3 is an enlarged view of portion E1 of FIG. 2.

FIGS. 4, 5, 6, 7, 8, 9, 10, 11, 12, 13, 14, 15, 16, 17, and 18 are views illustrating intermediate stages of a method of manufacturing a semiconductor package according to an embodiment of the present inventive concept. FIG. 8 is an enlarged view of portion E3 of FIG. 7.

FIG. 10 is an enlarged view of portion E3 of FIG. 9. FIG. 12 is an enlarged view of portion E4 of FIG. 11. FIG. 14 is an enlarged view of portion E5 of FIG. 13. FIG. 18 is an enlarged view of portion E6 of FIG. 17.

DETAILED DESCRIPTION OF THE EMBODIMENTS

Hereinafter, a semiconductor package according to an embodiment of the present inventive concept will be described with reference to FIGS. 1 to 3.

Figure 1:
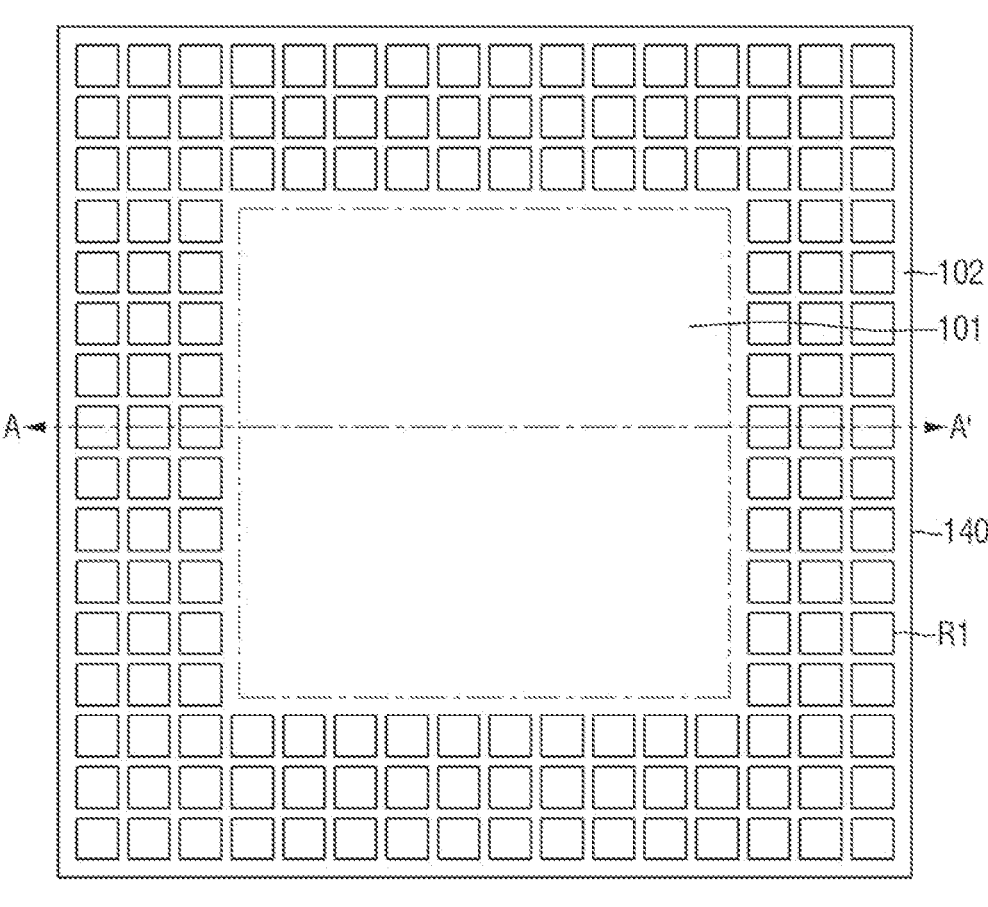
FIG. 1 is a schematic plan view of an upper surface of a semiconductor chip included in a semiconductor package according to an embodiment of the present inventive concept.
Figure 1:
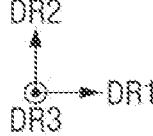

FIG. 1 is a schematic plan view of an upper surface of a semiconductor chip included in a semiconductor package according to an embodiment of the present inventive concept. FIG. 2 is a cross-sectional view of a semiconductor package according to an embodiment of the present inventive concept. FIG. 2 is a cross-sectional view taken along line A-A' of FIG. 1. FIG. 3 is an enlarged view of portion E1 of FIG. 2.

For example, a semiconductor package according to an embodiment of the present inventive concept may be a multi-chip semiconductor package, such as a high bandwidth memory (HBM), in which a plurality of semiconductor chips are stacked. Referring to FIGS. 1 to 3, the semiconductor package according to an embodiment of the present inventive concept includes a buffer semiconductor chip 10, a first semiconductor chip 100, a second semiconductor chip 200, and a third semiconductor chip 300.

The buffer semiconductor chip 10 may include a buffer substrate 11, a first bonding pad 12, a second bonding pad 13, and an external connection terminal 15.

For example, the buffer substrate 11 may be a substrate for a semiconductor package. In an embodiment of the present inventive concept, the buffer substrate 11 may be a printed circuit board (PCB), a ceramic substrate, or an interposer. In an embodiment of the present inventive concept, the buffer substrate 11 may be a substrate for a wafer level package manufactured at a wafer level. In an embodiment of the present inventive concept, the buffer substrate 11 may be a semiconductor chip including a semiconductor element.

The first bonding pad 12 may be disposed on a lower surface of the buffer substrate 11. The second bonding pad

13 may be disposed on an upper surface of the buffer substrate 11. The first bonding pad 12 and the second bonding pad 13 may each include a conductive material. For example, each of the first bonding pad 12 and the second bonding pad 13 may include at least one of tungsten (W), aluminum (Al), and/or copper (Cu), but the present inventive concept is not limited thereto.

The external connection terminal 15 may be disposed on the lower surface of the buffer substrate 11. The external connection terminal 15 may be connected to the first bonding pad 12. The external connection terminal 15 may protrude from the first bonding pad 12. The external connection terminal 15 may be a portion that is electrically connected to an external device (e.g., a panel of an electronic device, etc.). The external connection terminal 15 may include at least one of, for example, tin (Sn), indium (In), lead (Pb), zinc (Zn), nickel (Ni), gold (Au), silver (Ag), copper (Cu), antimony (Sb), bismuth (Bi), or a combination thereof, but the present inventive concept is not limited thereto.

Hereinafter, a first horizontal direction DR1 and a second horizontal direction DR2 are each directions parallel to the upper surface of the buffer substrate 11, and the second horizontal direction DR2 is substantially perpendicular to the first horizontal direction DR1. In addition, a vertical direction DR3 is a direction substantially perpendicular to each of the first and second horizontal directions DR1 and DR2 and as a direction substantially perpendicular to the upper surface of the buffer substrate 11.

The first semiconductor chip 100, the second semiconductor chip 200, and the third semiconductor chip 300 may be sequentially stacked on the upper surface of the buffer substrate 11. In an embodiment of the present inventive concept, the first semiconductor chip 100, the second semiconductor chip 200, and the third semiconductor chip 300 may each be a volatile memory, such as a dynamic random access memory (DRAM) or a static random access memory (SRAM), or a non-volatile memory, such as a flash memory, a phase-change random access memory (PRAM), a magnetoresistive random access memory (MRAM), a ferroelectric random access memory (FeRAM), or a resistive random access memory (RRAM).

In an embodiment of the present inventive concept, the first semiconductor chip 100, the second semiconductor chip 200, and the third semiconductor chip 300 may each be an integrated circuit (IC) in which a plurality of semiconductor elements are integrated into a single chip. For example, the first semiconductor chip 100, the second semiconductor chip 200, and the third semiconductor chip 300 may each be an application processor (AP), such as a central processing unit (CPU), a graphic processing unit (GPU), a field-programmable gate array (FPGA), a digital signal processor, an encryption processor, a micro-processor, a micro-controller, an application-specific IC, or the like.

The first semiconductor chip 100 may include a first wiring layer 110, a first front side bonding pad 121, a first connection terminal 125, a first semiconductor element layer 130, a first substrate 140, and a first recess R1, a first back side insulating layer 150, a second recess R2, a first through via 160, and a first back side bonding pad 170.

The first substrate 140 may be, for example, bulk silicon or a silicon-on-insulator (SOI). In addition, the first substrate 140 may be a silicon substrate, or may include other materials such as silicon germanium, silicon germanium on insulator (SGOI), indium antimonide, lead tellurium compound, indium arsenide, indium phosphide, gallium arsenic, or gallium antimonide, but the present inventive concept is not limited thereto.

The first substrate 140 may have a first surface 140*a* and a second surface 140*b* opposed to the first surface 140*a*. The first surface 140*a* of the first substrate 140 may face the buffer semiconductor chip 10.

The first substrate 140 may include a first region 101 and a second region 102 in a plane formed by the first horizontal direction DR1 and the second horizontal direction DR2. For example, the first region 101 may be a central region of the second surface 140*b* of the first substrate 140. The second region 102 may surround the first region 101. For example, the second region 102 may be an edge or peripheral area of the second surface 140*b* of the first substrate 140.

For example, the first through via 160, which will be described below, may be disposed in the first region 101. The first recess R1 and the second recess R2, which will be described below, may be disposed in the second region 102. However, the present inventive concept is not limited thereto. In an embodiment of the present inventive concept, the first through via 160 may be disposed in each of the first region 101 and the second region 102.

The first semiconductor element layer 130 may be disposed on the first surface 140*a* of the first substrate 140. For example, the first semiconductor element layer 130 may be in contact with the first surface 140*a* of the first substrate 140. The first semiconductor element layer 130 may include various microelectronic devices, for example, a metal-oxide-semiconductor field effect transistor (MOSFET) such as a complementary metal-insulator-semiconductor transistor (CMOS), a system large scale integration (LSI), a flash memory, a DRAM, a SRAM, an EEPROM, a PRAM, an MRAM, RERAM, an image sensor, such as a CMOS imaging sensor (CIS), a micro-electro-mechanical system (MEMS), an active device, a passive device, and the like.

The first wiring layer 110 may be disposed on the lower surface of the first semiconductor element layer 130 on the first surface 140*a* of the first substrate 140. The first wiring layer 110 may form a lower portion of the first semiconductor chip 100. The first wiring layer 110 may include a first wiring pattern 111 and a first interlayer insulating layer 112.

The first wiring pattern 111 may include a plurality of lines that are spaced apart from one another in each of in at least one of the first horizontal direction DR1, the second horizontal direction DR2, and/or the vertical direction DR3. The first wiring pattern 111 may include at least one of, for example, tungsten (W), aluminum (Al), or copper (Cu), but the present inventive concept is not limited thereto.

The first interlayer insulating layer 112 may at least partially surround the first wiring pattern 111. The first interlayer insulating layer 112 may include at least one of, for example, silicon oxide, silicon nitride, and/or silicon oxynitride, but the present inventive concept is not limited thereto. For example, the first interlayer insulating layer 112 may include tetraethyl orthosilicate (TEOS).

The first front side bonding pad 121 may be disposed on a lower surface of the first wiring layer 110. The first front side bonding pad 121 may be connected to the first wiring layer 110. The first front side bonding pad 121 may protrude from the lower surface of the first wiring layer 110. The first front side bonding pad 121 may include a conductive material. The first front side bonding pad 121 may include at least one of, for example, tungsten (W), aluminum (Al), and/or copper (Cu), but the present inventive concept is not limited thereto.

The first connection terminal 125 may be disposed between the second bonding pad 13 and the first front side bonding pad 121. The first connection terminal 125 may be in contact with each of the second bonding pad 13 and the first front side bonding pad 121. The first semiconductor chip 100 may be electrically connected to the buffer semiconductor chip 10 through the first connection terminal 125. The first connection terminal 125 may include at least one of, for example, tin (Sn), indium (In), lead (Pb), zinc (Zn), nickel (Ni), gold (Au), silver (Ag), copper (Cu), antimony (Sb), bismuth (Bi), or a combination thereof, but the present inventive concept is not limited thereto.

The first recess R1 may be formed on the second region 102 of the first substrate 140. The first recess R1 may be formed on the second surface 140*b* of the first substrate 140. The first recess R1 may be formed by forming a groove, indentation or recess into the first substrate 140 from the second surface 140*b* of the first substrate 140. For example, the first recess R1 may be spaced apart from the first through via 160, which will be described below, in the first horizontal direction DR1 or the second horizontal direction DR2.

The first recess R1 may include a plurality of recesses spaced apart from one another in each of the first horizontal direction DR1 and the second horizontal direction DR2. Although the first recesses R1 are arranged in three rows in each of the first horizontal direction DR1 and the second horizontal direction DR2 in FIG. 1, this is merely for convenience of description, and the arrangement and number of the first recesses R1 is not limited. In addition, although the planar shape of one first recess R1 is a quadrangle in FIG. 1, this is merely for convenience of description, and the planar shape of the first recess R1 is not limited.

The first back side insulating layer 150 may be disposed on the second surface 140*b* of the first substrate 140. For example, the first back side insulating layer 150 may be disposed in each of the first region 101 of the first substrate 140 and the second region 102 of the first substrate 140. For example, the first back side insulating layer 150 may be conformally formed. For example, the first back side insulating layer 150 may be formed with a substantially uniform thickness. However, the present inventive concept is not limited thereto.

The first back side insulating layer 150 may fill the inside of the first recess R1. For example, the first back side insulating layer 150 may completely fill the inside of the first recess R1. For example, the thickness t of the first back side insulating layer 150 may be greater than the depth d1 of the first recess R1. Here, the thickness t of the first back side insulating layer 150 may be a thickness in the vertical direction DR3 of the first back side insulating layer 150 disposed on the second surface 140*b* of the first substrate 140. In addition, the depth d1 of the first recess R1 may be a depth in the vertical direction DR3 from the bottom surface of the first recess R1 to the second surface 140*b* of the first substrate 140.

The first back side insulating layer 150 may include an insulating material. The first back side insulating layer 150 may include at least one of, for example, silicon oxide, silicon nitride, or silicon oxynitride, but the present inventive concept is not limited thereto.

The second recess R2 may be formed on the second region 102 of the first substrate 140. The second recess R2 may be disposed on the first recess R1. For example, the second recess R2 may overlap the first recess R1 in the vertical direction DR3. The second recess R2 may be defined by the first back side insulating layer 150. For example, the second recess R2 may be defined by the first back side insulating layer 150 conformally formed on the first recess R1. The second recess R2 may be formed by being recessed toward the second surface 140*b* of the first substrate 140 from an uppermost surface of the first back side insulating layer 150. For example, the second recess R2 may be spaced apart from the first through via 160, which will be described below, in the first horizontal direction DR1 or the second horizontal direction DR2.

The second recess R2 may include a plurality of recesses spaced apart from one another in each of the first horizontal direction DR1 and the second horizontal direction DR2. For example, the second recess R2 may be disposed at a position corresponding to the first recess R1.

For example, the thickness t of the first back side insulating layer 150 may be greater than the depth d2 of the second recess R1. Here, the depth d2 of the second recess R2 may be a depth in the vertical direction DR3 from the bottom surface R2*a* of the second recess R2 to the uppermost surface of the first back side insulating layer 150. For example, the bottom surface R2*a* of the second recess R2 may be higher than the second surface 140*b* of the first substrate 140. For example, the width W1 of the first recess R1 in the first horizontal direction DR1 may be greater than the width W2 of the second recess R2 in the first horizontal direction DR1. For example, the width of the first recess R1 in the second horizontal direction DR2 may be greater than the width of the second recess R2 in the second horizontal direction DR2.

The first through via 160 penetrates through the first back side insulating layer 150, the first region 101 of the first substrate 140, and the first semiconductor element layer 130 in the vertical direction DR3 and extend into the first wiring layer 110. The first through via 160 may be connected to the first wiring pattern 111. A sidewall of the first through via 160 protruding from the second surface 140*b* of the first substrate 140 may be surrounded by the first back side insulating layer 150.

For example, the first through via 160 may be disposed in the first region 101 of the first substrate 140. However, the present inventive concept is not limited thereto. In an embodiment of the present inventive concept, the first through via 160 may be disposed in each of the first region 101 and the second region 102. For example, the top surface of the first through via 160 may be formed on the same plane as the uppermost surface of the first back side insulating layer 150. However, the present inventive concept is not limited thereto.

The first through via 160 may include at least one of, for example, Cu alloy such as Cu, CuSn, CuMg, CuNi, CuZn, CuPd, CuAu, CuRe, CuW, and the like, W, W alloy, Ni, Ru, or Co. However, the present inventive concept is not limited thereto.

The first back side bonding pad 170 may be disposed on the first back side insulating layer 150. The first back side bonding pad 170 may be connected to the first through via 160. The first back side bonding pad 170 may include at least one of, for example, copper (Cu), tungsten (W), and/or aluminum (Al), but the present inventive concept is not limited thereto.

A first underfill material 181 may be disposed between the buffer semiconductor chip 10 and the first semiconductor chip 100. For example, the first underfill material 181 may be disposed between the upper surface of the buffer semiconductor chip 10 and the lower surface of the first wiring layer 110. The first underfill material 181 may surround sidewalls of each of the second bonding pad 13, the first front side bonding pad 121, and the first connection terminal 125. For example, the first underfill material 181 may protrude further than the sidewall of the first semiconductor chip 100 in a lateral direction, but the present inventive concept is not limited thereto.

The first underfill material 181 may include a material different from that of the first back side insulating layer 150. The first underfill material 181 may include, for example, an insulating polymer material such as an epoxy molding compound (EMC), but the present inventive concept is not limited thereto.

The second semiconductor chip 200 may include a second wiring layer 210, a second front side bonding pad 221, a second connection terminal 225, a second semiconductor element layer 230, a second substrate 240, and a second back side insulating layer 250, a second through via 260, and a second back side bonding pad 270. The second semiconductor chip 200 may have the same structure as the first semiconductor chip 100. For example, the second wiring pattern 211, a second interlayer insulating layer 212, the second front side bonding pad 221, the second connection terminal 225, the second semiconductor element layer 230, the second substrate 240, the second back side insulating layer 250, the second through via 260, and the second back side bonding pad 270 may have the same structure as the first wiring pattern 111, the first interlayer insulating layer 112, the first front side bonding pad 121, the first connection terminal 125, the first semiconductor element layer 130, the first substrate 140, the first back side insulating layer 150, the first through via 160, and the first back side bonding pad 170, respectively. Accordingly, detailed descriptions of components included in the second semiconductor chip 200 will be omitted.

The second semiconductor chip 200 may be disposed on the first semiconductor chip 100. The second semiconductor chip 200 may be electrically connected to the first semiconductor chip 100 through the second connection terminal 225. The second connection terminal 225 may be disposed between the first back side bonding pad 170 and the second front side bonding pad 221. The second connection terminal 225 may be in contact with each of the first back side bonding pad 170 and the second front side bonding pad 221.

A second underfill material 182 may be disposed between the first semiconductor chip 100 and the second semiconductor chip 200. For example, the second underfill material 182 may be disposed between the first back side insulating layer 150 and a lower surface of the second wiring layer 210. The second underfill material 182 may be in contact with an upper surface of the first back side insulating layer 150. The second underfill material 182 may at least partially surround sidewalls of each of the first back side bonding pad 170, the second front side bonding pad 221, and the second connection terminal 225. For example, the second underfill material 182 may protrude further than each of the sidewalls of the first semiconductor chip 100 and the sidewalls of the second semiconductor chip 200 in the lateral direction, but the present inventive concept is limited thereto.

The second underfill material 182 may fill the inside of the second recess R2. However, the second underfill material 182 is not disposed inside the first recess R1. The second underfill material 182 may include a material different from that of the first back side insulating layer 150. The second underfill material 182 may include, for example, an insulating polymer material such as an epoxy molding compound (EMC), but the present inventive concept is not limited thereto.

The third semiconductor chip 300 may include a third wiring layer 310, a third front side bonding pad 321, a third connection terminal 325, a third semiconductor element layer 330, and a third substrate 340. The third semiconductor chip 300 may have a structure similar to that of the first semiconductor chip 100. For example, each of a third wiring pattern 311, a third interlayer insulating layer 312, the third front side bonding pad 321, the third connection terminal 325, and the third semiconductor element layer 330 may respectively have the same structure as the first wiring pattern 111, the first interlayer insulating layer 112, the first front side bonding pad 121, the first connection terminal 125, and the first semiconductor element layer 130. Accordingly, detailed descriptions of the third wiring pattern 311, the third interlayer insulating layer 312, the third front side bonding pad 321, the third connection terminal 325, and the third semiconductor element layer 330 will be omitted. However, components which, respectively, correspond to the first recess R1, the first back side insulating layer 150, the second recess R2, and the first back side bonding pad 170 are not disposed on an upper surface of the third substrate 340. In addition, the third semiconductor chip 300 does not include a component corresponding to the first through via 160.

The third semiconductor chip 300 may be disposed on the second semiconductor chip 200. The third semiconductor chip 300 may be electrically connected to the second semiconductor chip 200 through the third connection terminal 325. The third connection terminal 325 may be disposed between the second back side bonding pad 270 and the third front side bonding pad 321. The third connection terminal 325 may be in contact with each of the second back side bonding pad 270 and the third front side bonding pad 321.

The third underfill material 183 may be disposed between the second semiconductor chip 200 and the third semiconductor chip 300. For example, the third underfill material 183 may be disposed between the second back side insulating layer 250 and a lower surface of the third wiring layer 310. The third underfill material 183 may be in contact with an upper surface of the second back side insulating layer 250. The third underfill material 183 may at least partially surround sidewalls of each of the second back side bonding pad 270, the third front side bonding pad 321, and the third connection terminal 325. For example, the third underfill material 183 may protrude further than each of the sidewalls of the second semiconductor chip 200 and the sidewalls of the third semiconductor chip 300 in the lateral direction, but the present inventive concept is limited thereto.

The third underfill material 183 may fill the inside of the recess formed in the second back side insulating layer 250. However, the third underfill material 183 is not disposed inside the recess formed on the upper surface of the second substrate 240. The third underfill material 183 may include a material different from that of the second back side insulating layer 250. The third underfill material 183 may include, for example, an insulating polymer material such as an epoxy molding compound (EMC), but the present inventive concept is not limited thereto.

A molding layer 190 may be disposed on the upper surface of the buffer substrate 11. The molding layer 190 may cover each of sidewalls of the first underfill material 181, sidewalls of the first semiconductor chip 100, sidewalls of the second underfill material 182, the sidewalls of the second semiconductor chip 200, sidewalls of the third underfill material 183, and the sidewalls and upper surface of the third semiconductor chip 300. However, the present inventive concept is not limited thereto. In an embodiment of the present inventive concept, the molding layer 190 might not cover the upper surface of the third semiconductor chip 300.

The molding layer 190 may include, for example, an epoxy molding compound (EMC) or two or more types of silicone hybrid materials. However, the present inventive concept is not limited thereto.

Hereinafter, a method of manufacturing a semiconductor package according to an embodiment of the present inventive concept will be described with reference to FIGS. 2 to 18.

FIGS. 4 to 18 are views illustrating intermediate stages of a method of manufacturing a semiconductor package according to an embodiment of the present inventive concept. FIG. 8 is an enlarged view of portion E3 of FIG. 7. FIG. 10 is an enlarged view of portion E3 of FIG. 9. FIG. 12 is an enlarged view of portion E4 of FIG. 11. FIG. 14 is an enlarged view of portion E5 of FIG. 13. FIG. 18 is an enlarged view of portion E6 of FIG. 17.

Figures 3, 4:
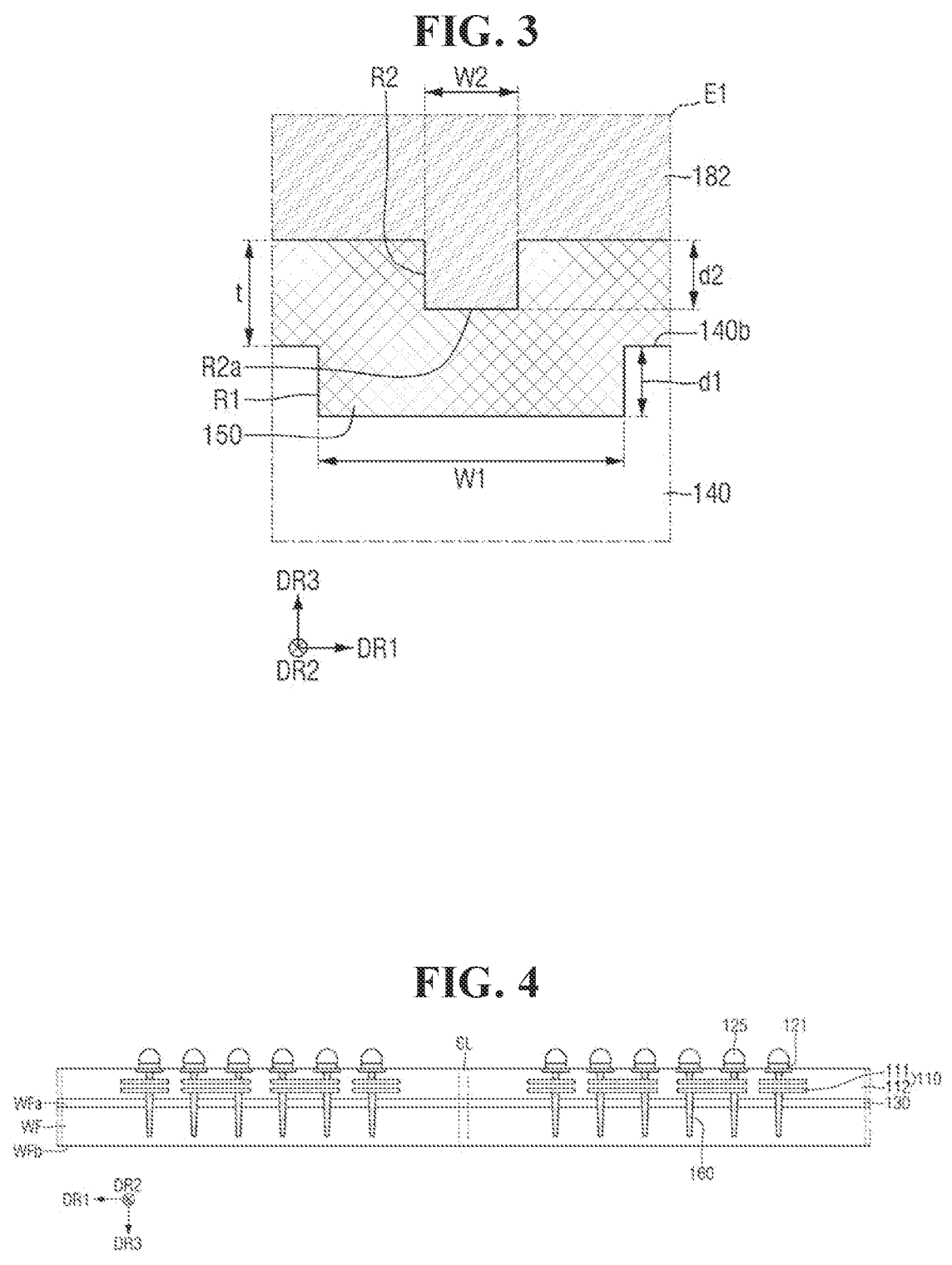

Referring to FIG. 4, a wafer WF including a first surface WFa and a second surface WFb, which opposes the first surface WFa, may be provided. Then, a first semiconductor element layer 130 may be formed on the first surface WFa of the wafer WF. Subsequently, a first through via 160 that penetrates through the first semiconductor element layer 130 in the vertical direction DR3 and extends into the wafer WF may be formed.

Then, a first wiring layer 110 which includes a first wiring pattern 111 and a first interlayer insulating layer 112 may be formed on the first semiconductor element layer 130. The first wiring pattern 111 may be connected to the first through via 160. Subsequently, a first front side bonding pad 121 and a first connection terminal 125 may be formed on the first wiring layer 110. The first front side bonding pad 121 may be connected to the first wiring layer 110.

Scribe lines SL may be formed in each of the wafer WF, the first semiconductor element layer 130, and the first wiring layer 110. The scribe lines SL may be regions to be cut in a subsequent sawing process. For example, each of the first wiring pattern 111, the first front side bonding pad 121, the first connection terminal 125, and the first through via 160 may be disposed between the scribe lines SL.

Figure 5:
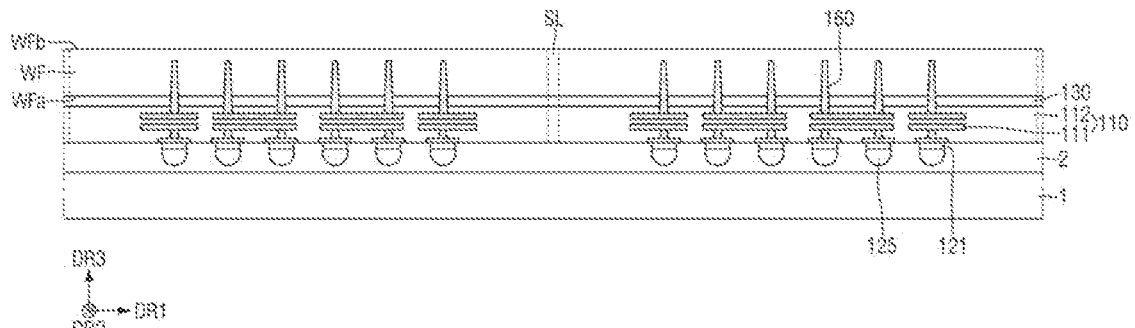

Referring to FIG. 5, a carrier substrate 1 having an adhesive layer 2 formed thereon may be provided. Then, the structure shown in FIG. 4 may be turned upside down and attached to the carrier substrate 1. For example, the structure shown in FIG. 4, which is turned upside down such that the first connection terminal 125 face the carrier substrate 1, may be attached to the adhesive layer 2. For example, each of the first front side bonding pad 121 and the first connection terminal 125 may be located inside the adhesive layer 2. The first wiring layer 110 may be disposed on the adhesive layer 2. For example, the first wiring layer 110 may be in contact with the adhesive layer 2.

Figure 6:
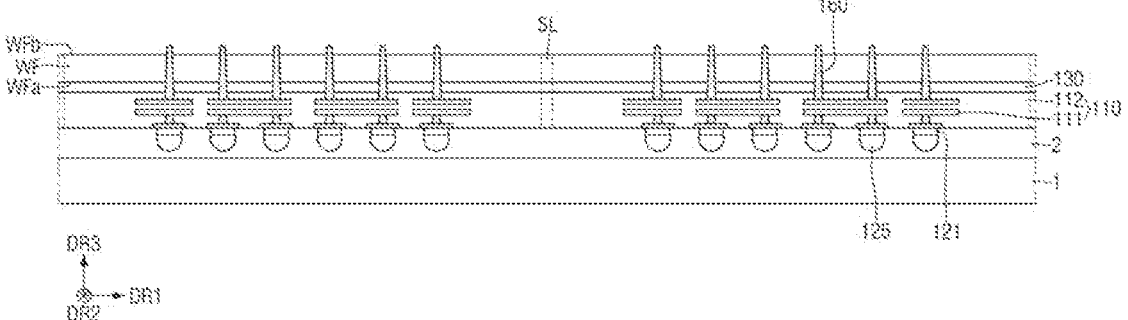

Referring to FIG. 6, a portion of the second surface WFb of the wafer WF may be etched to expose a portion of the first through via 160. For example, the portion of the second surface WFb of the wafer WF may be etched using a chemical mechanical polishing (CMP) process, an etch-back process, or a combination thereof.

Figure 7:
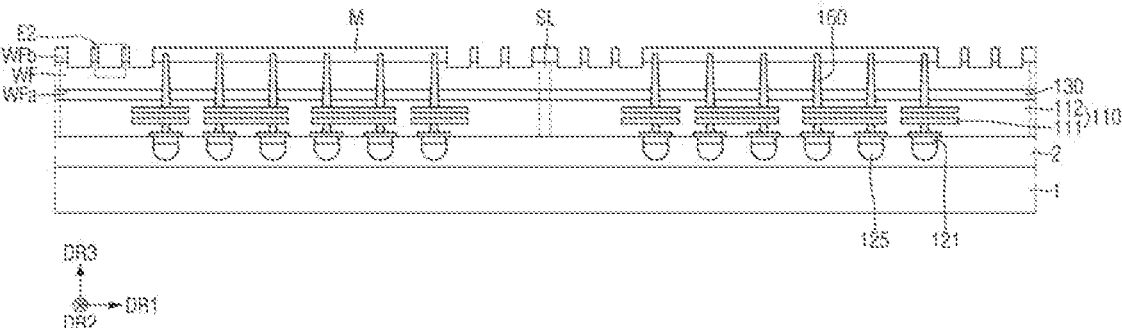
Figure 8:
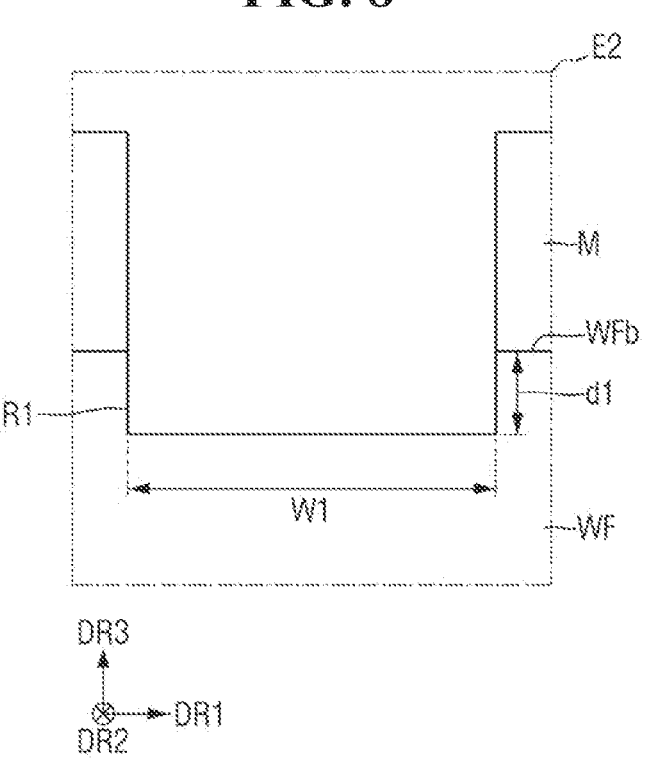

Referring to FIGS. 7 and 8, a mask pattern M may be formed on the second surface WFb of the wafer WF. The mask pattern M may expose a portion of the second surface WFb of the wafer WF adjacent to the scribe lines SL. Subsequently, the wafer WF may be etched using the mask pattern M as a mask to form a first recess R1. For example, the first recess R1 may be formed in the second surface WFb of the wafer WF adjacent to the scribe lines SL. For example, the first recess R1 may be formed in a region where the first through via 160 is not disposed.

Figure 9:
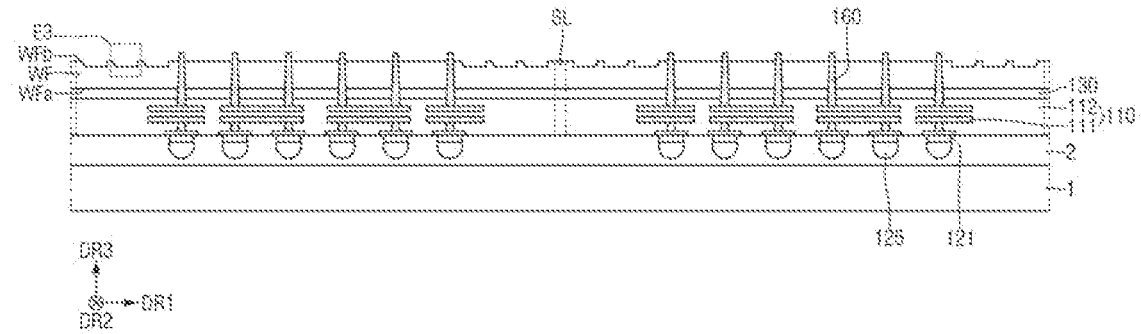
Figure 10:
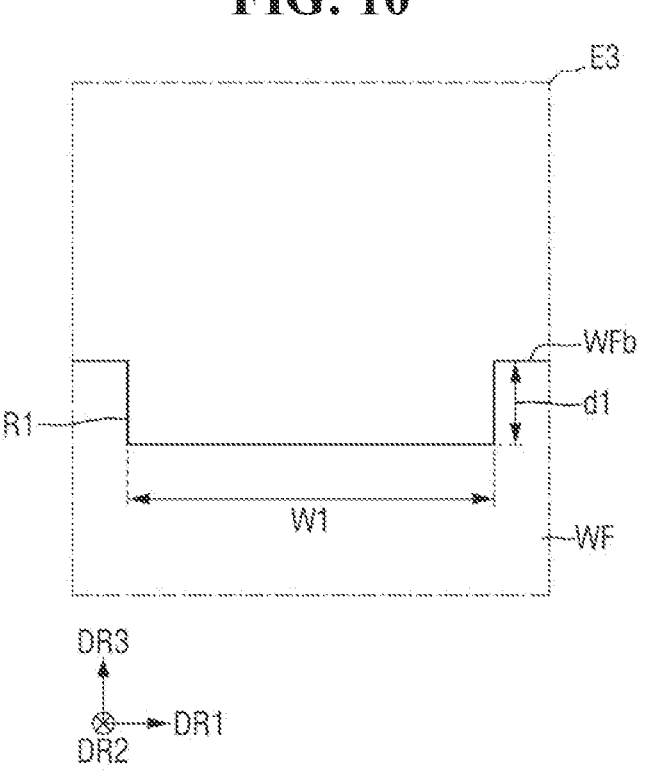

Referring to FIGS. 9 and 10, the mask pattern M may be removed.

Figure 11:
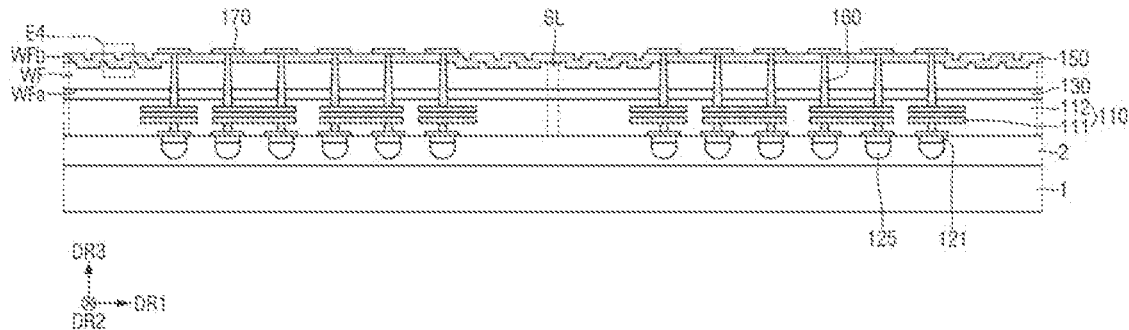
Figure 12:
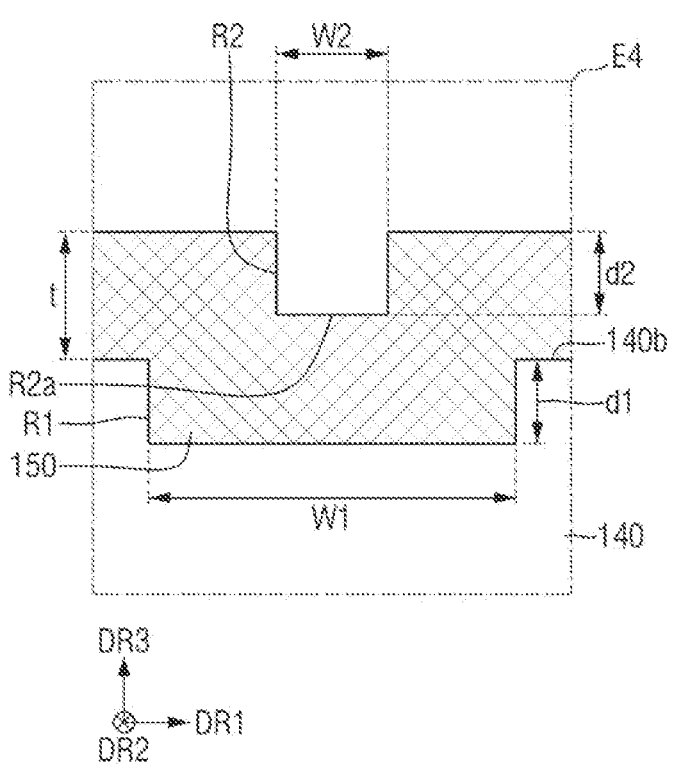

Referring to FIGS. 11 and 12, a first back side insulating layer 150 may be formed on the second surface WFb of the wafer WE. For example, the first back side insulating layer 150 may be conformally formed on the wafer WE. For example, the first back side insulating layer 150 may be formed to have a substantially uniform thickness. Accordingly, a second recess R2 formed in the first back side insulating layer 150 may be defined on the first recess R1. The second recess R2 may overlap the first recess R1 in the vertical direction DR3.

The first back side insulating layer 150 may fill the inside of the first recess R1. For example, the first back side insulating layer 150 may completely fill the inside of the first recess R1. The first back side insulating layer 150 may at least partially surround sidewalls of the first through via 160 exposed on the second surface WFb of the wafer WF. For example, an upper surface of the first through via 160 may be exposed from an upper surface of the first back side insulating layer 150.

For example, the thickness t of the first back side insulating layer 150 formed on the second surface WFb of the wafer WF may be greater than the depth d1 of the first recess R1 in the vertical direction DR3. For example, the thickness t of the first back side insulating layer 150 may be greater than the depth d2 of the second recess R2. For example, the bottom surface R2a of the second recess R2 may be higher than the second surface 140b of the first substrate 140. For example, the width W1 of the first recess R1 in the first horizontal direction DR1 may be greater than the width W2 of the second recess R2 in the first horizontal direction DR1.

Subsequently, a first back side bonding pad 170 may be formed on the first back side insulating layer 150. The first back side bonding pad 170 may be formed to overlap the first through via 160 in the vertical direction DR3. The first back side bonding pad 170 may be connected to the first through via 160.

Figure 13:
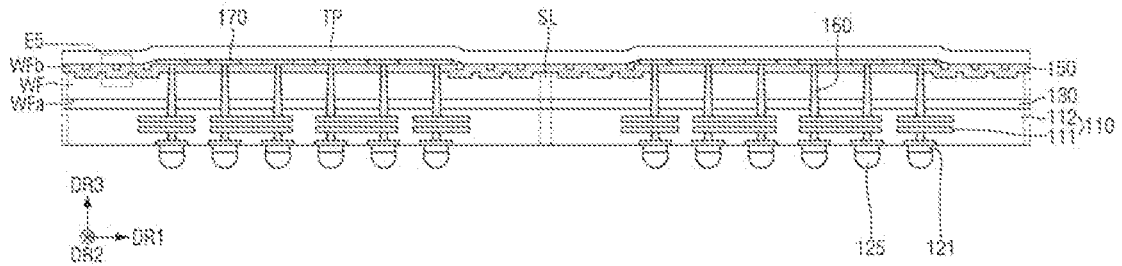
Figure 14:
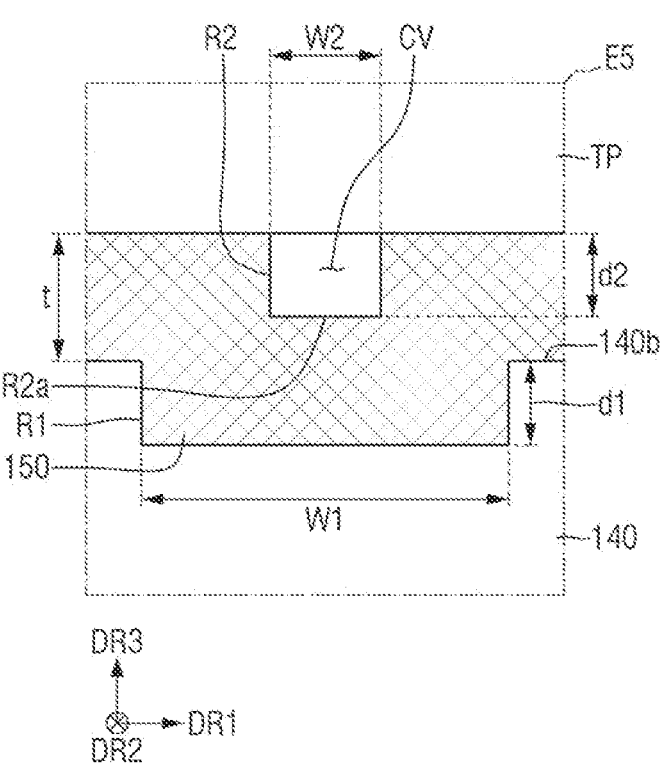

Referring to FIGS. 13 and 14, the carrier substrate 1 (in FIG. 11) and the adhesive layer 2 (in FIG. 11) may be separated from the first wiring layer 110, the first front side bonding pad 121, and the first connection terminal 125. Then, a tape TP may be attached to each of the first back side insulating layer 150 and the first back side bonding pad 170. For example, a cavity CV may be formed within the second recess R2 between the first back side insulating layer 150 and the tape TP. Accordingly, a contact area between the first back side insulating layer 150 and the tape TP may be reduced in a region adjacent to the scribe lines SL.

Figure 15:
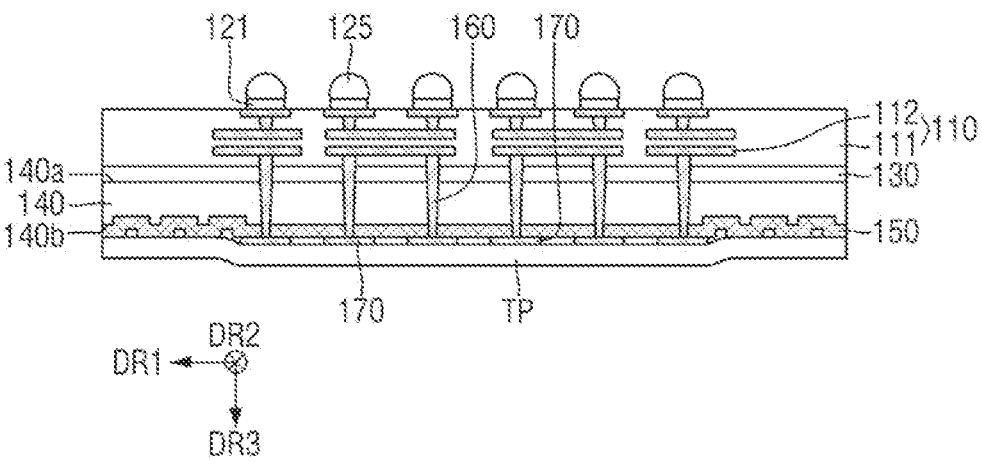

Referring to FIG. 15, a sawing process may be performed along the scribe line SL (in FIG. 13). By the sawing process, the tape TP, the first back side insulating layer 150, the wafer WF (in FIG. 13), the first semiconductor element layer 130, and the first wiring layer 110 may be sawed along the scribe line SL (in FIG. 13). After the sawing process is performed, the wafer WF (in FIG. 13) may be defined as a first substrate 140.

After the sawing process is performed, the first substrate 140 which includes the first wiring layer 110, the first front side bonding pad 121, the first connection terminal 125, the first semiconductor element layer 130, the first substrate 140, the first recess R1 (in FIG. 14), the first back side insulating layer 150, the second recess R2 (in FIG. 14), the first through via 160, and the first back side bonding pad 170 may be formed. In addition, after the sawing process is performed, the tape TP may stay attached to the first back side insulating layer 150 and the first back side bonding pad 170. FIG. 15 illustrates an upside down state after the sawing process.

Figure 16:
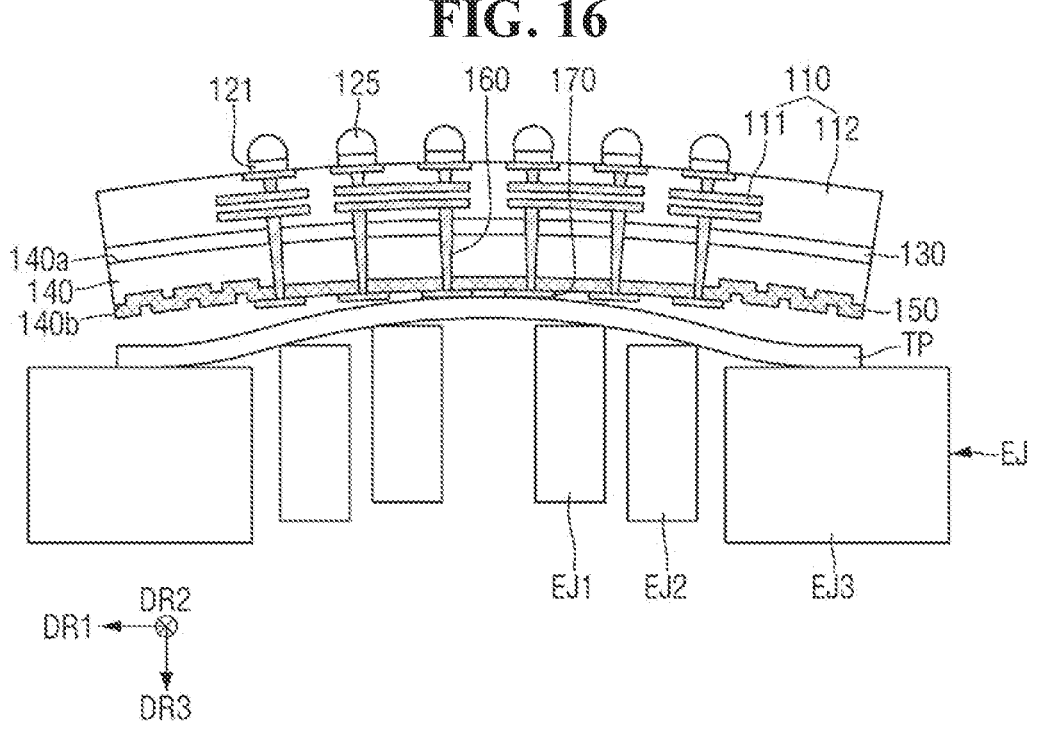

Referring to FIG. 16, the tape TP may be separated from the first back side insulating layer 150 using an ejector EJ. For example, the ejector EJ may include first to third portions EJ1, EJ2, and EJ3 that are driven at different heights. For example, the first portion EJ1 of the ejector EJ may be disposed in a central region of the ejector EJ. The third portion EJ3 of the ejector EJ may be disposed in an edge region of the ejector EJ. The second portion EJ2 of the ejector EJ may be disposed between the first portion EJ1 of the ejector EJ and the third portion EJ3 of the ejector EJ. The structure of the ejector EJ shown in FIG. 16 is illustrative, and the structure of the ejector EJ is not limited.

For example, as shown in FIG. 16, when the ejector EJ is driven, the ejector EJ may be driven such that an upper surface of the second portion EJ2 is higher than an upper surface of the third portion EJ3 while the third portion EJ3 of the ejector EJ is fixed. In addition, the ejector EJ may be driven such that an upper surface of the first portion EJ1 is higher than the upper surface of the second portion EJ2. In this case, the central region of the tape TP may be positioned on the upper surface of the first portion EJ1 of the ejector EJ, and the edge of the tape TP may be positioned on the upper surface of the third portion EJ3 of the ejector EJ.

For example, when the ejector EJ is driven, as shown in FIG. 16, the edge of the tape TP attached to the portion where the second recess R2 (in FIG. 14) is formed may be separated preferentially over the central region of the tape TP attached to the first back side bonding pad 170. In the semiconductor package according to an embodiment of the present inventive concept, the second recess R2 (in FIG. 14) is formed in the exposed surface of the edge of the first back side insulating layer 150, so that the contact area between the first back side insulating layer 150 and the tape TP is reduced, thereby facilitating separation of the tape TP from the first back side insulating layer 150. Accordingly, the semiconductor package according to an embodiment of the present inventive concept may prevent the semiconductor chip (100 in FIG. 2) from being damaged in the process of separating the tape TP from the semiconductor chip (100 in FIG. 2).

Figure 17:
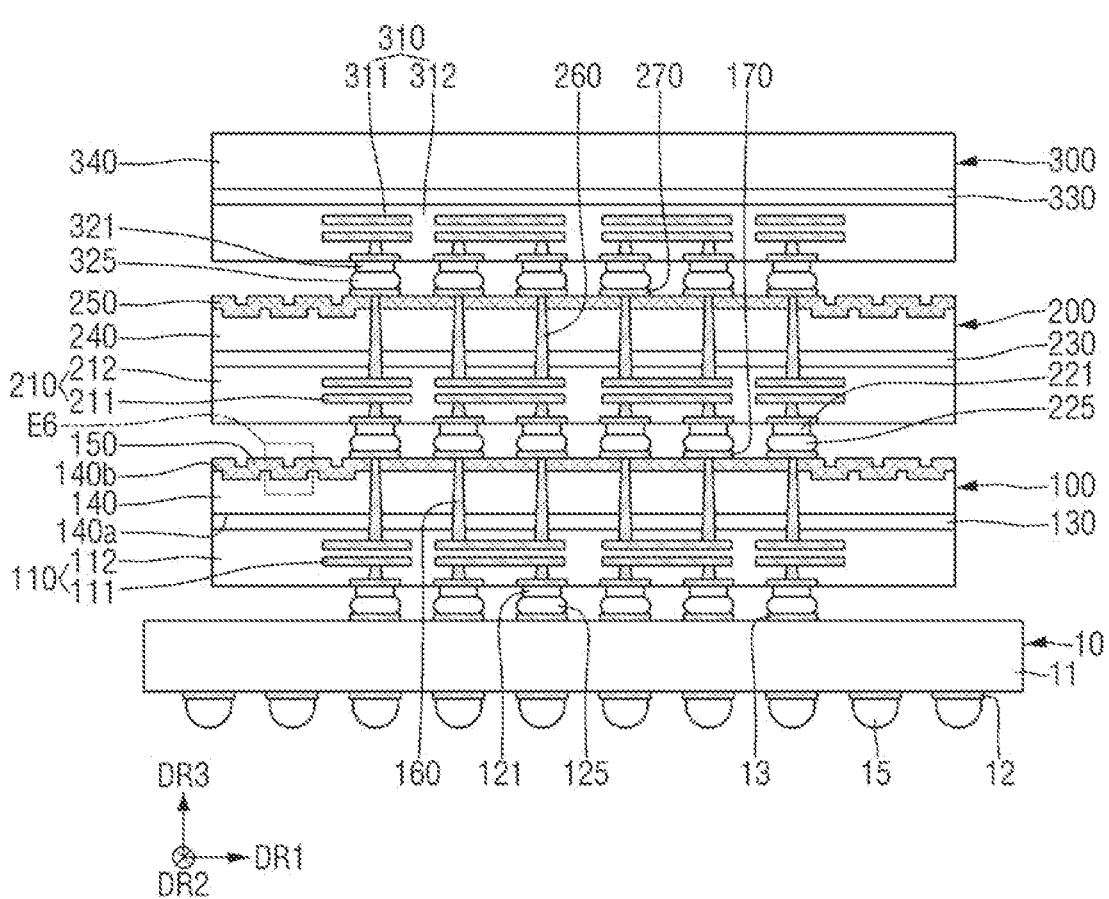
Figure 18:
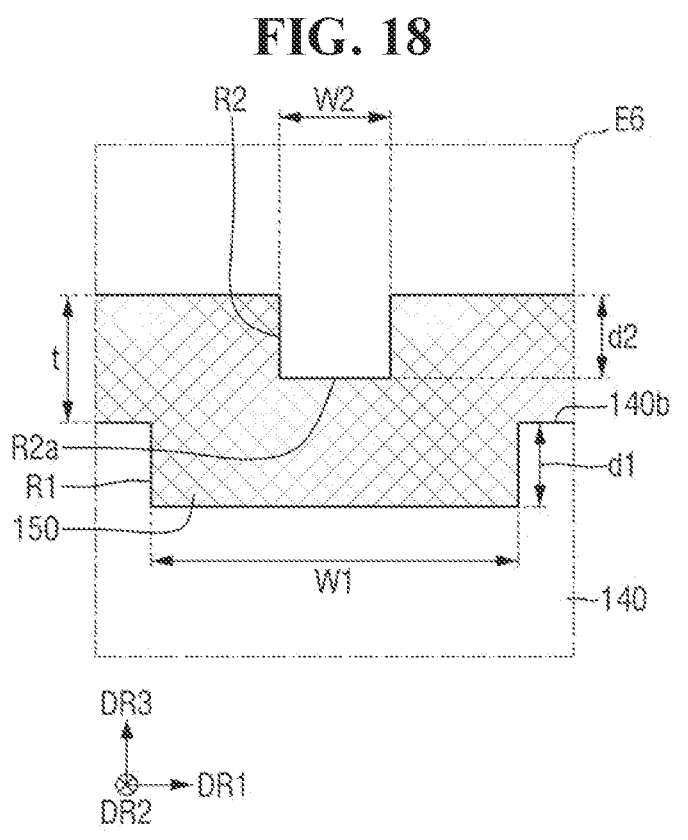

Referring to FIGS. 17 and 18, the first semiconductor chip 100 from which the tape TP is separated may be turned upside down and bonded onto the buffer semiconductor chip 10. For example, the first semiconductor chip 100 may be bonded onto the upper surface of the buffer semiconductor chip 10 using the first connection terminal 125.

In addition, the second semiconductor chip 200 may be bonded onto the first semiconductor chip 100. For example, the second semiconductor chip 200 may be bonded onto the first back side insulating layer 150 of the first semiconductor chip 100 using the second connection terminal 225. In addition, the third semiconductor chip 300 may be bonded onto the second semiconductor chip 200. For example, the third semiconductor chip 300 may be bonded onto the second back side insulating layer 250 of the second semiconductor chip 200 using the third connection terminal 325.

In an embodiment of the present inventive concept, after the first to third semiconductor chips 100, 200, and 300 are bonded to each other, the first semiconductor chip 100 may be bonded onto the buffer semiconductor chip 10. In an embodiment of the present inventive concept, the first to third semiconductor chips 100, 200, and 300 may be sequentially bonded onto the buffer semiconductor chip 10.

Figure 2:
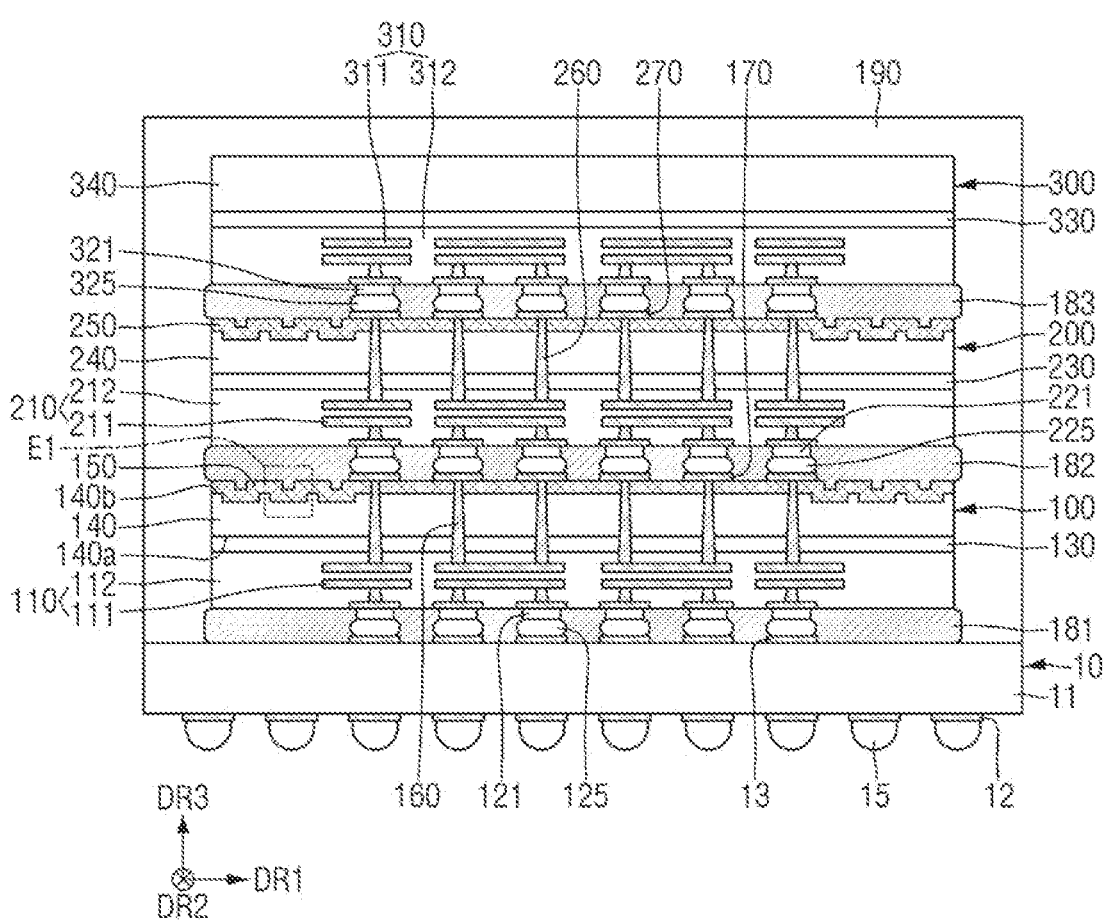
FIG. 2 is a cross-sectional view taken along line A-A' of FIG. 1.

Referring to FIGS. 2 and 3, a first underfill material 181 may be formed between the buffer semiconductor chip 10 and the first semiconductor chip 100. The first underfill material 181 may at least partially surround sidewalls of each of the second bonding pad 13, the first front side bonding pad 121, and the first connection terminal 125.

In addition, a second underfill material 182 may be formed between the first semiconductor chip 100 and the second semiconductor chip 200. The second underfill material 182 may at least partially surround sidewalls of each of the first back side bonding pad 170, the second front side bonding pad 221, and the second connection terminal 225. The second underfill material 182 may fill the inside of the second recess R2. However, the second underfill material 182 is not formed inside the first recess R1.

In addition, a third underfill material 183 may be formed between the second semiconductor chip 200 and the third semiconductor chip 300. The third underfill material 183 may at least partially surround sidewalls of each of the second back side bonding pad 270, the third front side bonding pad 321, and the third connection terminal 325. The third underfill material 183 may fill the inside of the recess formed in the second back side insulating layer 250. However, the third underfill material 183 is not formed inside the recess formed on the upper surface of the second substrate 240. Each of the first to third underfill materials 181, 182, and 183 may include a material different from that of each of the first and second back side insulating layers 150 and 250.

Thereafter, a molding layer 190 may be formed to cover each of sidewalls of the first underfill material 181, sidewalls of the first semiconductor chip 100, sidewalls of the second underfill material 182, the sidewalls of the second semiconductor chip 200, sidewalls of the third underfill material 183, and the sidewalls and upper surface of the third semiconductor chip 300. By the manufacturing process, the semiconductor package shown in FIGS. 2 and 3 may be manufactured.

Hereinafter, a semiconductor package according to an embodiment of the present inventive concept will be described with reference to FIG. 19. A description will be focusing on differences from the semiconductor package shown in FIGS. 1 to 3, and redundant descriptions may be omitted or briefly discussed.

Figure 19:
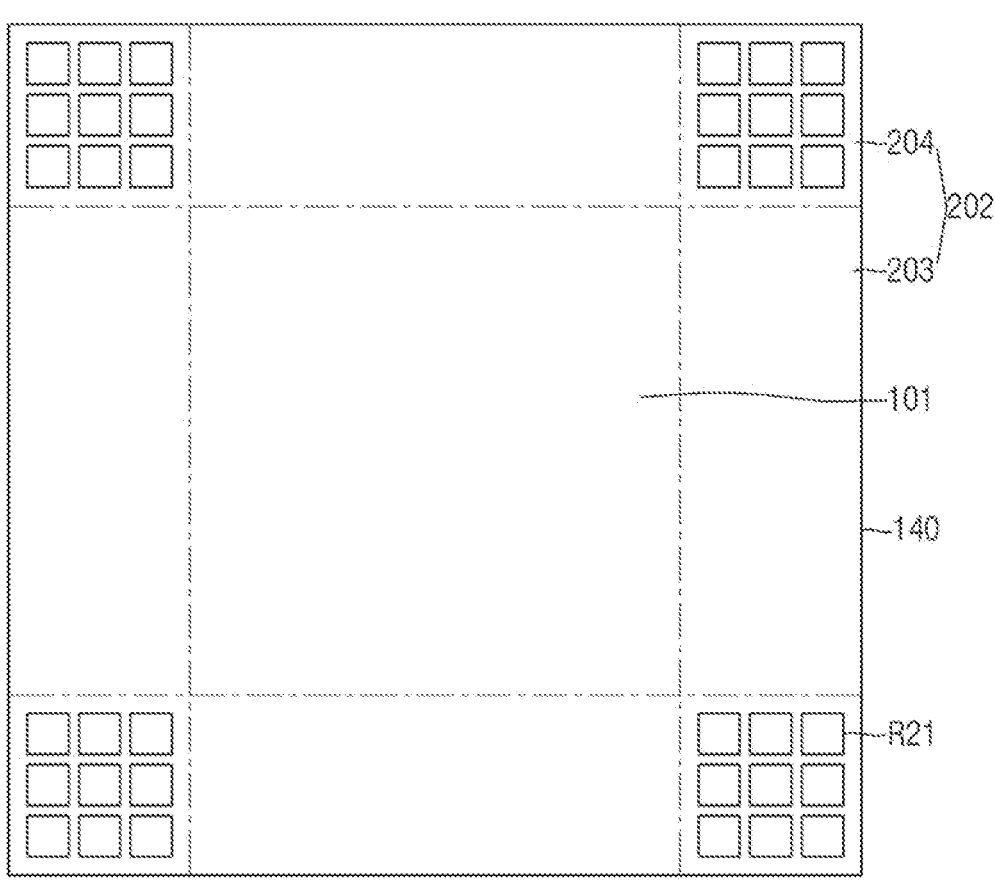
FIG. 19 is a schematic plan view of an upper surface of a semiconductor chip included in a semiconductor package according to an embodiment of the present inventive concept.
Figure 19:
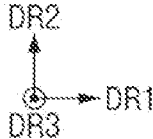

FIG. 19 is a schematic plan view of an upper surface of a semiconductor chip included in a semiconductor package according to an embodiment of the present inventive concept.

Referring to FIG. 19, a first recess R21 may be formed in a portion of a second region 202 of a first substrate 140 of a first semiconductor chip (100 in FIG. 2) included in a semiconductor package according to an embodiment of the present inventive concept.

For example, the second region 202 of the first substrate 140 may include a third region 203 and a fourth region 204. The third region 203 of the first substrate 140 may be a region that overlaps a first region 101 of the first substrate 140 in each of the first horizontal direction DR1 and the second horizontal direction DR2. The fourth region 204 of the first substrate 140 may be a region that does not overlap the first region 101 of the first substrate 140 in each of the first horizontal direction DR1 and the second horizontal direction DR2. For example, the third region 203 of the first substrate 140 may be formed between the fourth regions 204 of the first substrate 140. For example, the fourth regions 204 may be adjacent to corners of first substrate 140.

For example, the first recess R21 may be formed on a second surface (140b in FIG. 2) in the fourth region 204 of the first substrate 140. The first recess R21 may include a plurality of recesses spaced apart from one another in each of the first horizontal direction DR1 and the second horizontal direction DR2. The first recess R21 might not be formed on the second surface (140b in FIG. 2) in the third region 203 of the first substrate 140. The second recess (R2 in FIG. 2) may be located at a position corresponding to the first recess R21 and may be formed on the first recess R21.

Hereinafter, a semiconductor package according to an embodiment of the present inventive concept will be described with reference to FIG. 20. A description will be focusing on differences from the semiconductor package shown in FIGS. 1 to 3, and redundant descriptions may be omitted or briefly discussed.

Figure 20:
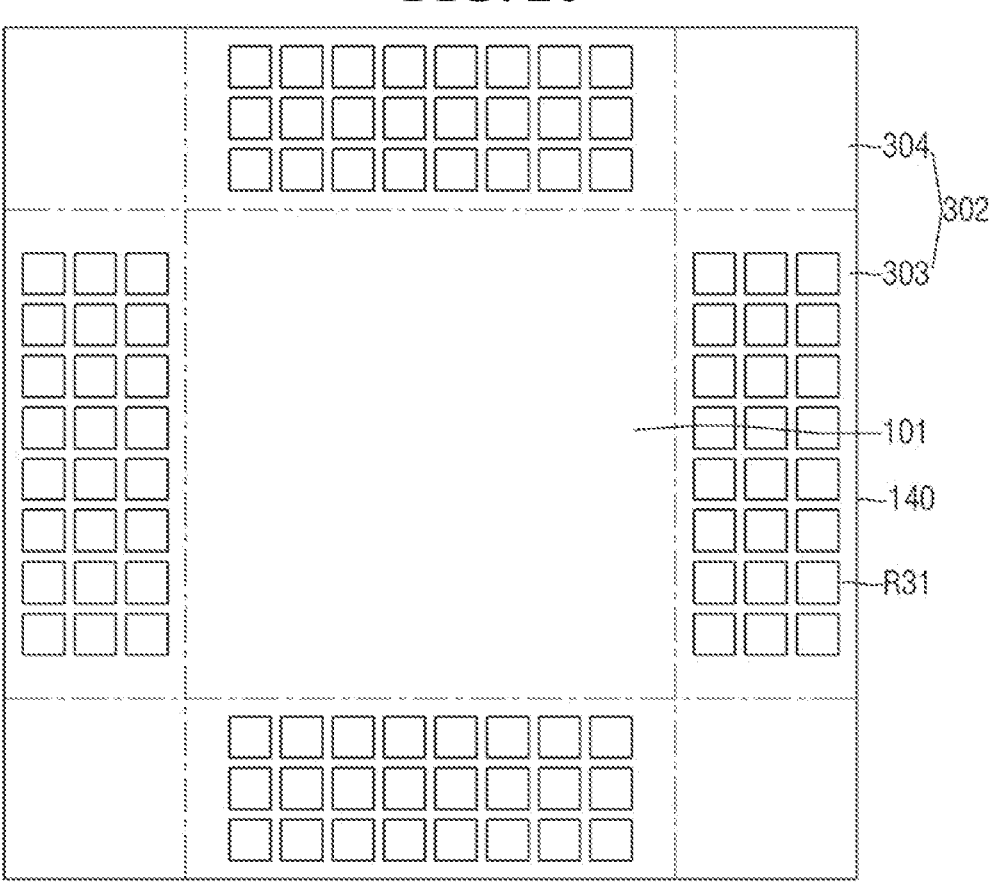
FIG. 20 is a schematic plan view of an upper surface of a semiconductor chip included in a semiconductor package according to an embodiment of the present inventive concept.
Figure 20:

FIG. 20 is a schematic plan view of an upper surface of a semiconductor chip included in a semiconductor package according to an embodiment of the present inventive concept.

Referring to FIG. 20, a first recess R21 may be formed in a portion of a second region 302 of a first substrate 140 of a first semiconductor chip (100 in FIG. 2) included in a semiconductor package according to an embodiment of the present inventive concept.

For example, the second region 302 of the first substrate 140 may include a third region 303 and a fourth region 304. The third region 303 of the first substrate 140 may be a region that overlaps a first region 101 of the first substrate 140 in each of the first horizontal direction DR1 and the second horizontal direction DR2. The fourth region 304 of the first substrate 140 may be a region that does not overlap the first region 101 of the first substrate 140 in each of the first horizontal direction DR1 and the second horizontal direction DR2. For example, the third region 303 of the first substrate 140 may be formed between the fourth regions 304 of the first substrate 140. For example, the third region 303 of the first substrate 140 may extend along edges of the first substrate 140 between the fourth regions 304 of the first substrate 140.

For example, the first recess R31 may be formed on a second surface (140b in FIG. 2) in the third region 303 of the first substrate 140. The first recess R31 may include a plurality of recesses spaced apart from one another in each of the first horizontal direction DR1 and the second horizontal direction DR2. The first recess R31 might not be formed on the second surface (140b in FIG. 2) in the fourth region 304 of the first substrate 140. The second recess (R2 in FIG. 2) may be located at a position corresponding to the first recess R31 and may be formed on the first recess R31.

Hereinafter, a semiconductor package according to an embodiment of the present inventive concept will be described with reference to FIG. 21. A description will be focusing on differences from the semiconductor package shown in FIGS. 1 to 3, and redundant descriptions may be omitted or briefly discussed.

Figure 21:
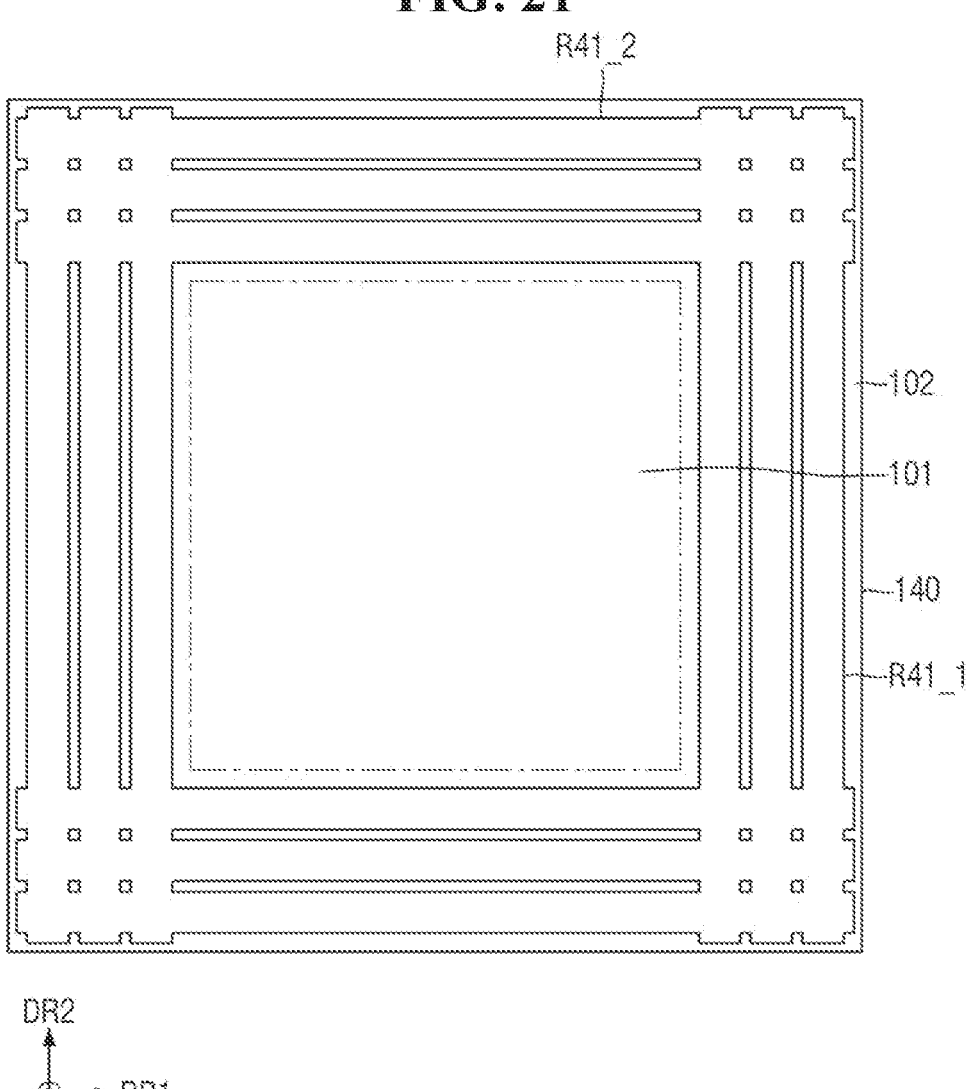
FIG. 21 is a schematic plan view of an upper surface of a semiconductor chip included in a semiconductor package according to an embodiment of the present inventive concept.

FIG. 21 is a schematic plan view of an upper surface of a semiconductor chip included in a semiconductor package according to an embodiment of the present inventive concept.

Referring to FIG. 21, a first recess R41_1 and R41_2 may be formed in a line shape on a second surface (140b in FIG. 2) of a first substrate 140 of a first semiconductor chip (100 in FIG. 2) included in a semiconductor package according to an embodiment of the present inventive concept.

For example, the first recess R41_1 and R41_2 may include a first sub-recess R41_1 extending in the second horizontal direction DR2 and a second sub-recess R41_2 extending in the first horizontal direction DR1. The first sub-recess R41_1 and the second sub-recess R41_2 may intersect each other in a portion of a second region 102 that does not overlap a first region 101 of the first substrate 140 in each of the first horizontal direction DR1 and the second horizontal direction DR2.

For example, a second recess (R2 in FIG. 2) may be located at a position corresponding to the first recess R41_1 and R42_2 and may be formed on the first recess R41_1 and R41_2. The second recess (R2 in FIG. 2) may include a sub-recess extending in the first horizontal direction DR1 and a sub-recess extending in the second horizontal direction DR2.

Hereinafter, a semiconductor package according to an embodiment of the present inventive concept will be described with reference to FIG. 22. A description will be focusing on differences from the semiconductor package shown in FIGS. 1 to 3, and redundant descriptions may be omitted or briefly discussed.

Figure 22:
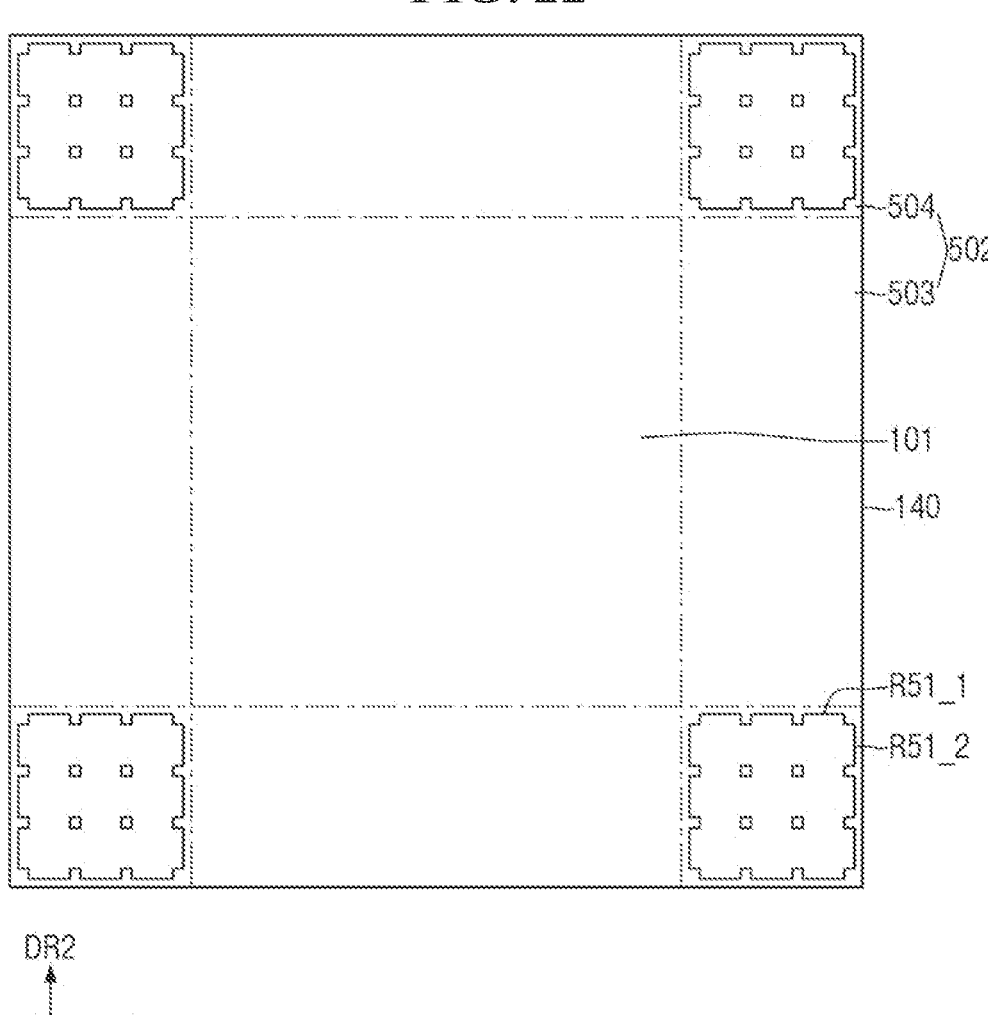
FIG. 22 is a schematic plan view of an upper surface of a semiconductor chip included in a semiconductor package according to an embodiment of the present inventive concept.
Figure 22:
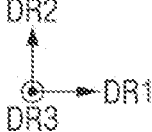

FIG. 22 is a schematic plan view of an upper surface of a semiconductor chip included in a semiconductor package according to an embodiment of the present inventive concept.

Referring to FIG. 22, a first recess R51_1 and R51_2 may be formed in a mesh shape on a second surface (140*b* in FIG. 2) of a first substrate 140 of a first semiconductor chip (100 in FIG. 2) included in a semiconductor package according to an embodiment of the present inventive concept.

For example, the second region 502 of the first substrate 140 may include a third region 503 and a fourth region 504. The third region 503 of the first substrate 140 may be a region that overlaps a first region 101 of the first substrate 140 in each of the first horizontal direction DR1 and the second horizontal direction DR2. The fourth region 504 of the first substrate 140 may be a region that does not overlap the first region 101 of the first substrate 140 in each of the first horizontal direction DR1 and the second horizontal direction DR2. For example, the third region 503 of the first substrate 140 may be formed between the fourth regions 504 of the first substrate 140. For example, the third region 503 of the first substrate 140 may extend along edges of the first substrate 140 between the fourth regions 504 of the first substrate 140.

For example, the first recess R51_1 and R51_2 may be formed on a second surface (140*b* in FIG. 2) in the fourth region 504 of the first substrate 140. The first recess R51_1 and R51_2 might not be formed on the second surface (140*b* in FIG. 2) in the third region 503 of the first substrate 140. For example, the first recess R51_1 and R51_2 may include a first sub-recess R51_1 extending in the second horizontal direction DR2 and a second sub-recess R51_2 extending in the first horizontal direction DR1. The first sub-recess R51_1 and the second sub-recess R51_2 may intersect each other to form a mesh shape.

For example, a second recess (R2 in FIG. 2) may be located at a position corresponding to the first recess R51_1 and R52_2 and may be formed on the first recess R51_1 and R51_2. The second recess (R2 in FIG. 2) may be formed in a mesh shape.

Hereinafter, a semiconductor package according to an embodiment of the present inventive concept will be described with reference to FIG. 23. A description will be focusing on differences from the semiconductor package shown in FIGS. 1 to 3, and redundant descriptions may be omitted or briefly discussed.

Figure 23:
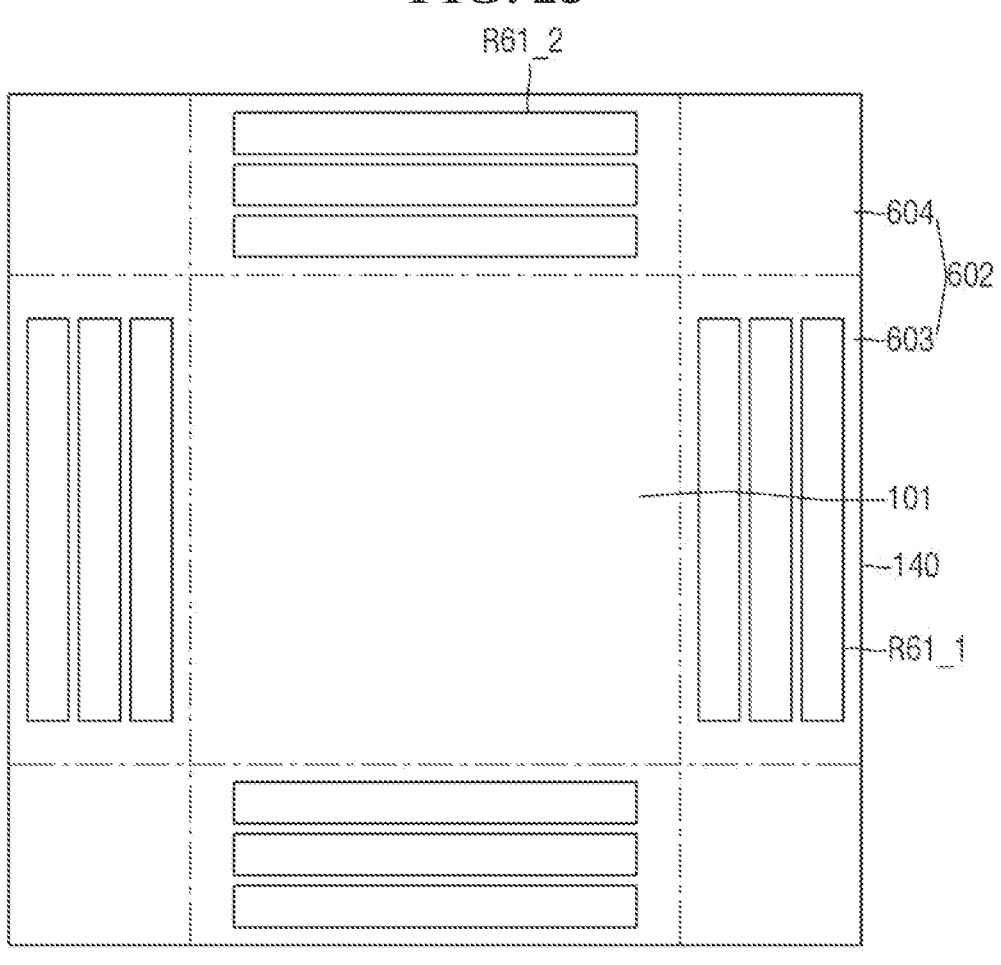
FIG. 23 is a schematic plan view of an upper surface of a semiconductor chip included in a semiconductor package according to an embodiment of the present inventive concept.
Figure 23:

FIG. 23 is a schematic plan view of an upper surface of a semiconductor chip included in a semiconductor package according to an embodiment of the present inventive concept.

Referring to FIG. 22, a first recess R61_1 and R61_2 may be formed in a line shape on a second surface (140*b* in FIG. 2) of a first substrate 140 of a first semiconductor chip (100 in FIG. 2) included in a semiconductor package according to an embodiment of the present inventive concept. For example, the first recess R61_1 and R61_2 may have rectangular shapes.

For example, a second region 602 of the first substrate 140 may include a third region 603 and a fourth region 604. The third region 603 of the first substrate 140 may be a region that overlaps a first region 101 of the first substrate 140 in each of the first horizontal direction DR1 and the second horizontal direction DR2. A fourth region 604 of the first substrate 140 may be a region that does not overlap the first region 101 of the first substrate 140 in each of the first horizontal direction DR1 and the second horizontal direction DR2. For example, the third region 603 of the first substrate 140 may be formed between the fourth regions 604 of the first substrate 140.

For example, the first recess R61_1 and R61_2 may be formed on a second surface (140*b* in FIG. 2) in the third region 603 of the first substrate 140. The first recess R61_1 and R61_2 might not be formed on the second surface (140*b* in FIG. 2) in the fourth region 604 of the first substrate 140. For example, the first recess R61_1 and R61_2 may include a first sub-recess R61_1 extending in the second horizontal direction DR2 and a second sub-recess R61_2 extending in the first horizontal direction DR1.

For example, a second recess (R2 in FIG. 2) may be located at a position corresponding to the first recess R61_1 and R46_2 and may be formed on the first recess R61_1 and R61_2. The second recess (R2 in FIG. 2) may include a sub-recess extending in the first horizontal direction DR1 and a sub-recess extending in the second horizontal direction DR2.

While the present inventive concept has been described with reference to exemplary embodiments thereof, it will be understood by those of ordinary skill in the art that various changes in form and details may be made thereto without departing from the spirit and scope of the present inventive concept.

What is claimed:

1. A semiconductor package comprising:
    a substrate including a first region and a second region at least partially surrounding the first region in a plane defined by a first horizontal direction and a second horizontal direction perpendicular to the first horizontal direction, wherein the substrate has a first surface and a second surface opposed to the first surface;
    a wiring pattern disposed on the first surface of the substrate;
    a first recess formed on the second surface of the substrate and in the second region of the substrate;
    a back side insulating layer disposed on the second surface of the substrate, wherein the back side insulating layer fills an inside of the first recess;
    a through via penetrating through the first region of the substrate and the back side insulating layer, wherein the through via connects to the wiring pattern; and
    a second recess formed in the back side insulating layer and on the first recess,
    wherein a bottom surface of the second recess is formed higher than the second surface of the substrate.

2. The semiconductor package of claim 1, wherein a thickness of the back side insulating layer is greater than a depth of the first recess in a vertical direction perpendicular to the first and second horizontal directions.

3. The semiconductor package of claim 1, wherein a thickness of the back side insulating layer is greater than a depth of the second recess in a vertical direction perpendicular to the first and second horizontal directions.

4. The semiconductor package of claim 1, wherein a width of the first recess in the first horizontal direction is greater than a width of the second recess in the first horizontal direction.

5. The semiconductor package of claim 1, wherein the first recess comprises a plurality of recesses spaced apart from one another in each of the first and second horizontal directions.

6. The semiconductor package of claim 1, wherein the first recess comprises a first sub-recess and a second sub-recess, wherein the first sub-recess extends in the first horizontal direction, and the second sub-recess extends in the second horizontal direction.

7. The semiconductor package of claim 6, wherein the first sub-recess and the second sub-recess intersect each other.

8. The semiconductor package of claim 1, wherein the second region of the substrate comprises a third region and a fourth region, wherein the third region overlaps the first region of the substrate in each of the first and second horizontal directions, and the fourth region does not overlap the first region of the substrate in each of the first and second horizontal directions, wherein the first recess is not formed in the third region of the substrate, and wherein the first recess is formed in the fourth region of the substrate.

9. The semiconductor package of claim 1, wherein the second region of the substrate comprises a third region and a fourth region, wherein the third region overlaps the first region of the substrate in each of the first and second horizontal directions, and the fourth region does not overlap the first region of the substrate in each of the first and second horizontal directions, wherein the first recess is formed in the third region of the substrate, and wherein the first recess is not formed in the fourth region of the substrate.

10. The semiconductor package of claim 1, wherein the back side insulating layer is formed to have a uniform thickness.

11. A semiconductor package comprising:

a first semiconductor chip;

a second semiconductor chip disposed on the first semiconductor chip;

a connection terminal configured to electrically connect the first semiconductor chip to the second semiconductor chip; and an underfill material configured to at least partially surround sidewalls of the connection terminal between the first semiconductor chip and the second semiconductor chip, wherein the first semiconductor chip comprises:

a substrate including a first region and a second region at least partially surrounding the first region in a plane defined by a first horizontal direction and a second horizontal direction perpendicular to the first horizontal direction, wherein the substrate has a first surface and a second surface opposed to the first surface;

a wiring pattern disposed on the first surface of the substrate;

a first recess formed on the second surface of the substrate and in the second region of the substrate;

a back side insulating layer disposed on the second surface of the substrate, wherein the back side insulating layer fills an inside of the first recess and comprises a material different from that of the underfill material;

a through via penetrating through the first region of the substrate and the back side insulating layer, wherein the through via connects to the wiring pattern; and a second recess formed in the back side insulating layer and on the first recess, wherein the second recess is filled with the underfill material, wherein a bottom surface of the second recess is formed higher than the second surface of the substrate.

12. The semiconductor package of claim 11, wherein a thickness of the back side insulating layer is greater than a depth of the first recess in a vertical direction perpendicular to the first and second horizontal directions.

13. The semiconductor package of claim 11, wherein the first recess comprises a plurality of recesses spaced apart from one another in each of the first and second horizontal directions.

14. The semiconductor package of claim 11, wherein the first recess comprises a first sub-recess and a second sub-recess, wherein the first sub-recess extends in the first horizontal direction, and the second sub-recess extends in the second horizontal direction.

* * * * *